(12) United States Patent
Kemmoku

(10) Patent No.: US 9,244,364 B2
(45) Date of Patent: Jan. 26, 2016

(54) EXPOSURE APPARATUS AND DEVICE MANUFACTURING METHOD

(71) Applicant: CANON KABUSHIKI KAISHA, Tokyo (JP)

(72) Inventor: Hiromi Kemmoku, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 326 days.

(21) Appl. No.: 13/863,444

(22) Filed: Apr. 16, 2013

(65) Prior Publication Data

US 2013/0314682 A1 Nov. 28, 2013

(30) Foreign Application Priority Data

May 22, 2012 (JP) ................................ 2012-116913

(51) Int. Cl.
*G03F 7/20* (2006.01)
*G03G 15/043* (2006.01)

(52) U.S. Cl.
CPC ........ *G03F 7/70558* (2013.01); *G03F 7/70358* (2013.01); *G03G 15/043* (2013.01)

(58) Field of Classification Search
CPC ............ G03F 7/70558; G03F 7/70625; G03F 7/70066; G03F 7/70358
See application file for complete search history.

(56) References Cited

U.S. PATENT DOCUMENTS

| | | | | |
|---|---|---|---|---|
| 5,526,093 A | * | 6/1996 | Takahashi | 355/53 |
| 5,581,075 A | * | 12/1996 | Naraki et al. | 250/205 |
| 5,728,495 A | * | 3/1998 | Ozawa | 430/30 |
| 6,736,928 B2 | * | 5/2004 | Kotoku | 156/345.3 |
| 2001/0018153 A1 | * | 8/2001 | Irie | 430/5 |
| 2003/0147059 A1 | * | 8/2003 | Tokuda et al. | 355/53 |
| 2005/0024610 A1 | * | 2/2005 | Nishi et al. | 355/53 |
| 2007/0188725 A1 | * | 8/2007 | Sakai | 355/53 |
| 2007/0275329 A1 | * | 11/2007 | Ziger et al. | 430/311 |
| 2010/0123888 A1 | * | 5/2010 | Kemmoku | 355/55 |
| 2012/0244476 A1 | * | 9/2012 | Heo et al. | 430/319 |

FOREIGN PATENT DOCUMENTS

| | | | |
|---|---|---|---|
| JP | 07-029810 A | | 1/1995 |
| JP | 11-38638 A | | 2/1999 |
| JP | 2005-197362 A | | 7/2005 |
| JP | 2010-074043 A | | 4/2010 |

OTHER PUBLICATIONS

Japanese Office Action for corresponding JP 2012-116913, mail date Apr. 14, 2014.

* cited by examiner

*Primary Examiner* — Steven H Whitesell Gordon
(74) *Attorney, Agent, or Firm* — Rossi, Kimms & McDowell LLP

(57) ABSTRACT

An exposure apparatus includes a control unit configured to calculate a target exposure amount distribution in a scanning direction within the target shot region using a target exposure amount at a position in the target shot region and a target exposure amount at a position in an adjacent shot region adjacent to the target shot region in the scanning direction and configured to perform a scan exposure for the target shot region while controlling an exposure amount according to scanning of the substrate so as to obtain the calculated target exposure amount distribution as an exposure amount distribution in a scanning direction within the target shot region.

12 Claims, 8 Drawing Sheets

F I G. 7B
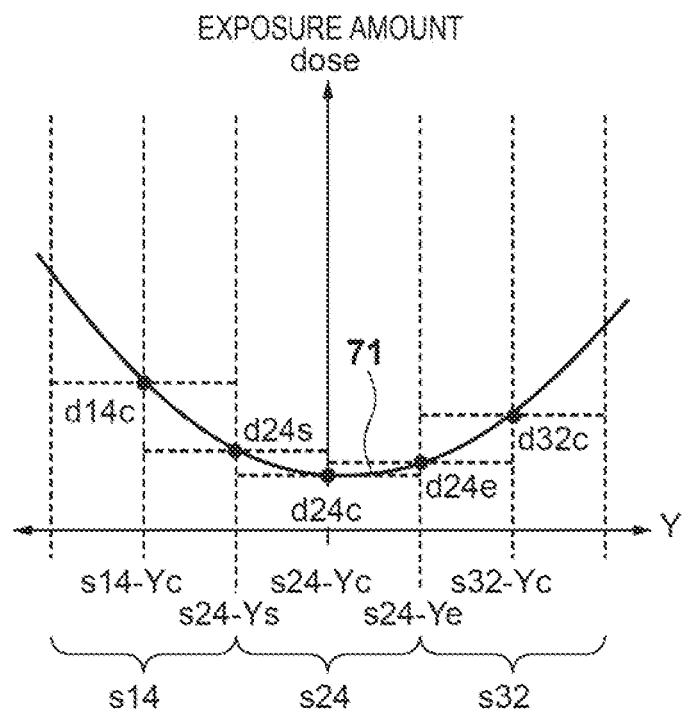
F I G. 7C
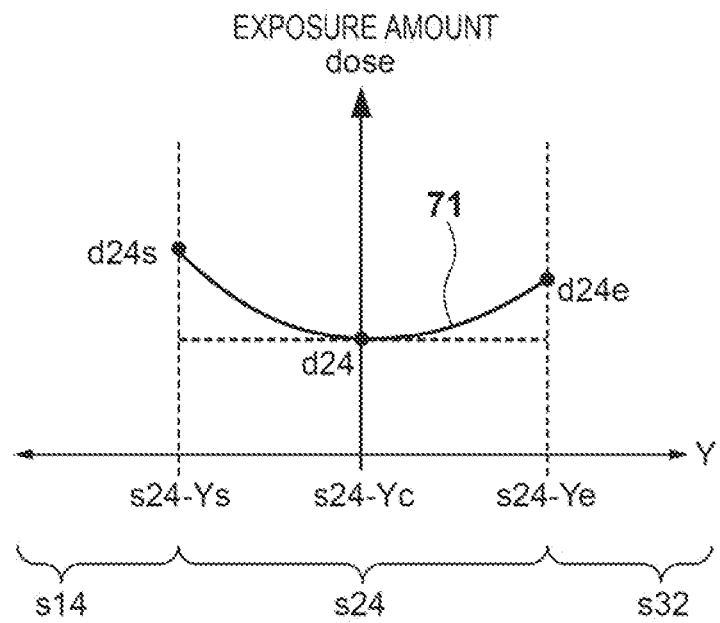

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

A process of manufacturing a semiconductor device formed from an extra fine pattern has conventionally adopted a reduction projection exposure apparatus which reduces and projects, on a substrate such as a wafer coated with a photoresist, a circuit pattern drawn on a reticle (mask), thereby exposing the substrate. Along with an improvement in the packaging density of semiconductor devices, further micropatterning of a circuit pattern is required, and an exposure apparatus which can uniform the finishing size (line width) of a pattern is desired.

A conventional exposure apparatus exposes a photoresist coated on a substrate with an exposure amount (dose) corresponding to the photoresist. An exposure apparatus adopting the step-and-repeat scheme repeatedly performs an exposure with a given exposure amount while moving in a shot region on a substrate. Even if, however, the exposure apparatus repeatedly exposes a photoresist with a given exposure amount in each shot within a substrate plane, there is a difference (pattern line width error) between the line width of the obtained pattern and that of a designed pattern. To maintain the line width uniformity of a pattern, various exposure methods of correcting an exposure amount depending on a shot have been disclosed. For example, Japanese Patent Laid-Open No. 2005-197362 discloses a method of controlling, as an nth-order polynomial function, an exposure amount at a position in each shot on a substrate plane. Furthermore, Japanese Patent Laid-Open No. 7-29810 discloses a method of controlling an exposure amount according to the distance from the center position on a substrate plane.

The conventional techniques adjust an exposure amount within the substrate plane but do not adjust an exposure amount for uniforming a line width distribution within a shot region, thereby disabling precise adjustment of a pattern line width error within each shot region.

SUMMARY OF THE INVENTION

The present invention provides an exposure apparatus for improving the line width uniformity of a pattern within a shot region.

The present invention provides an exposure apparatus of performing a scan exposure for each shot region on a substrate, the apparatus comprising: a control unit configured to calculate a target exposure amount distribution in a scanning direction within the target shot region using a target exposure amount at a position in the target shot region and a target exposure amount at a position in an adjacent shot region adjacent to the target shot region in the scanning direction and configured to perform a scan exposure for the target shot region while controlling an exposure amount according to scanning of the substrate so as to obtain the calculated target exposure amount distribution as an exposure amount distribution in a scanning direction within the target shot region.

Further features of the present invention will become apparent from the following description of exemplary embodiments with reference to the attached drawings.

BRIEF DESCRIPTION OF THE DRAWINGS

FIGS. 7A to 7C are views for explaining calculation of an exposure amount distribution within a shot region.

DESCRIPTION OF THE EMBODIMENTS

An embodiment of the present invention will be described in detail below with reference to the accompanying drawings.

Embodiment of Exposure Apparatus

Figure 1:
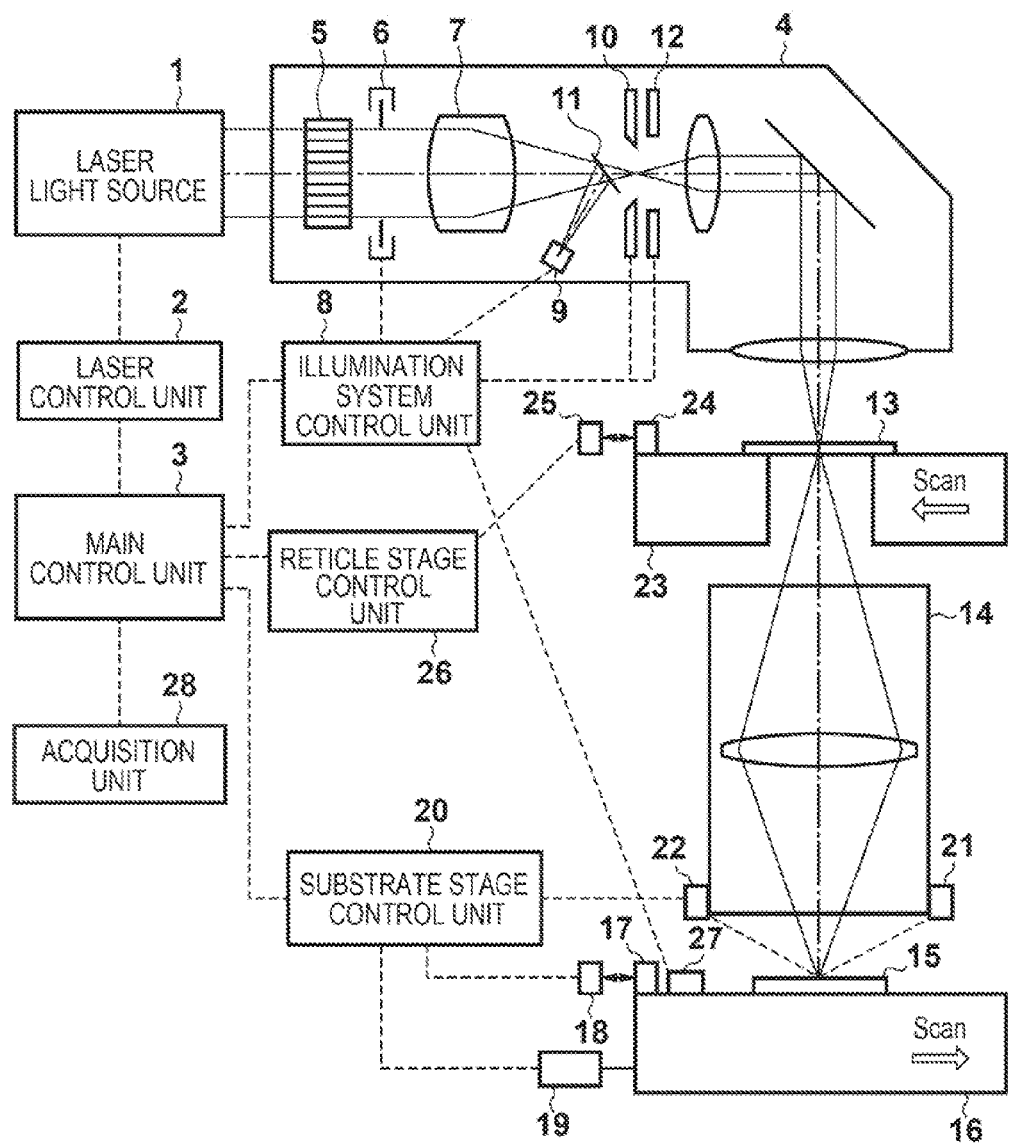
FIG. 1 is a view showing the schematic arrangement of an exposure apparatus.

FIG. 1 shows the schematic arrangement of a step-and-scan type exposure apparatus (scan exposure apparatus) according to the embodiment of the present invention. The exposure apparatus uses slit-shaped light on an original and substrate (wafer) to scan them and expose each shot region on the substrate via the original. A laser light source 1 which is filled with, for example, ArF gas, and emits a laser beam generates light with a wavelength of 193 nm in the far-ultraviolet range. The laser light source 1 includes a front mirror forming a resonator, a band-narrowing module, a monitor module, and a shutter. The band-narrowing module includes a diffraction grating and a prism, and narrows the band of the exposure wavelength. The monitor module includes a spectroscope and a detector, and monitors the spectral width.

A laser control unit 2 controls the gas exchange operation, wavelength stabilization, discharge application voltage, and the like of the laser light source 1. In this embodiment, the laser light source 1 is not controlled by the control operation of the laser control unit 2 alone, but can be controlled by an instruction from a main control unit 3 of the entire exposure apparatus which is connected by an interface cable. The main control unit 3 is a computer having a function of obtaining a target exposure amount distribution within a shot region (to be described later), and controlling a scan exposure according to scanning of the substrate so as to obtain the target exposure amount distribution as an exposure amount distribution within the shot region.

A laser beam emitted by the laser light source 1 is shaped into a predetermined shape through the shaping optical system (not shown) of an illumination optical system 4, and is then incident on an integrator lens 5, thereby forming a secondary light source. A condenser lens 7 has a function of changing the illuminance distribution of an original (to also be referred to as a mask or reticle hereinafter) 13. The condenser lens 7 guides a light beam from the secondary light source to a variable slit 10 whose aperture width can be changed, and performs Koehler illumination for the variable slit 10. The variable slit 10 has a mechanism capable of changing the aperture width, and uniforms the light intensity distribution (illuminance distribution) of slit-shaped light (exposure light) 33 in a non-scanning direction by controlling the aperture width.

An aperture stop 6 has an almost circular aperture. An illumination system control unit 8 can set the diameter of the aperture and accordingly the numerical aperture (NA) of the illumination optical system to desired values. The ratio of the numerical aperture of the illumination optical system 4 to that of a rectangular lens 14 as a projection optical system (to be described later) is a coherence factor (σ value). The illumination system control unit 8 can, therefore, set the σ value by controlling the aperture stop 6 of the illumination optical system 4.

A half mirror 11 is inserted in the optical path of the illumination optical system 4, and reflects and extracts part of the exposure light which illuminates the reticle 13. A photosensor 9 is arranged on the optical path of the light reflected by the half mirror 11, and generates an output corresponding to the intensity (exposure energy) of the exposure light. The output from the photosensor 9 is converted into exposure energy per pulse by an integration circuit (not shown) which performs integration for each pulse emission of the laser light source 1. The converted exposure energy is input to the main control unit 3 which controls the entire exposure apparatus via the illumination system control unit 8.

Figure 2:
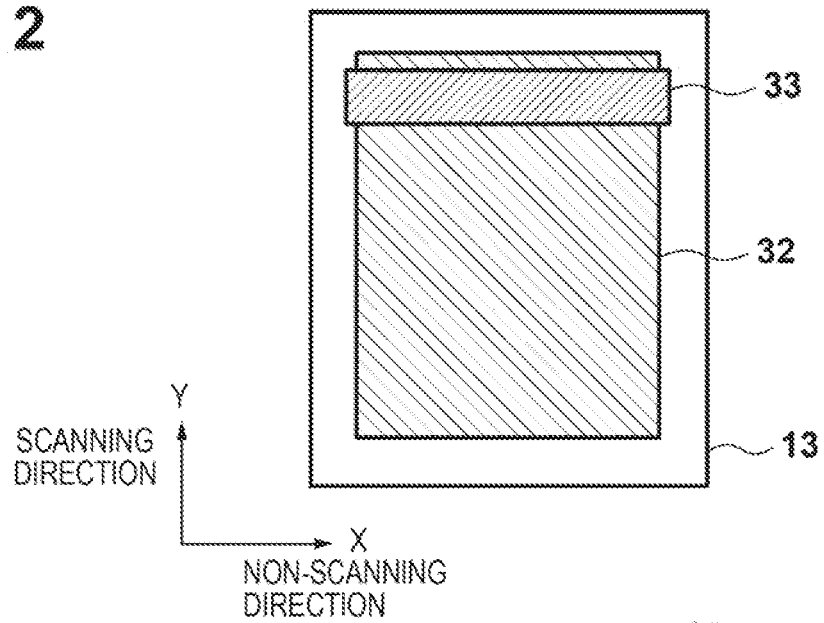
FIG. 2 is a view for explaining part of the arrangement shown in FIG. 1.

An aperture stop (not shown) having an almost circular aperture is arranged on the pupil plane (the Fourier transformation plane with respect to the reticle 13) of the projection optical system 14. A driving mechanism such as a motor controls the diameter of the aperture, thereby setting the diameter to a desired value. A pattern 32 corresponding to the circuit pattern of the semiconductor device is formed on the reticle 13, and is illuminated by the illumination optical system 4. A variable blade 12 which is variable in two dimensional directions enables to arbitrarily set an irradiation region of the pattern plane of the reticle 13 by arranging a movable light-shielding member within a plane perpendicular to an optical axis. FIG. 2 shows a state in which the reticle 13 is illuminated. The slit-shaped light 33 shielded by the variable blade 12 illuminates part of the pattern 32 indicated by hatch lines on the reticle. The projection optical system 14 shown in FIG. 1 reduces and exposes part of the pattern 32 on a substrate 15 coated with a photoresist at a reduction ratio β (β is, for example, ¼).

The reticle 13 and substrate 15 are scanned in opposite directions with the slit-shaped light 33 at a speed ratio equal to the reduction ratio β of the projection optical system 14. A multi-pulse exposure with a pulse emission from the laser light source 1 is repeated. As a result, the pattern 32 on the entire surface of the reticle 13 is transferred to a shot region (to be simply referred to as a shot, and corresponding to one or a plurality of chip regions) on the substrate 15. Assume that an axis parallel to the optical axis of the projection optical system 14 is set as the Z-axis. In this case, in FIG. 2, among two axes perpendicular to the Z-axis and to each other, an axis parallel to the scanning direction of the substrate 15 or a substrate stage 16 (to be described later) is set as the Y-axis, and the other axis is set as the X-axis.

The substrate stage 16 is movable in three dimensional directions while holding the substrate 15, and can move in the direction of the optical axis (the Z direction) of the projection optical system 14 and within a plane (X-Y plane) perpendicular to the direction of the optical axis. A laser interferometer 18 measures the distance to a moving mirror 17 fixed to the substrate stage 16, thereby detecting the position of the substrate stage 16 on the X-Y plane. A substrate stage control unit 20 is under the control of the main control unit 3, and detects the position of the substrate stage 16 by the laser interferometer 18 and controls a driving mechanism 19 such as a motor to move the substrate stage 16 to a predetermined position on the X-Y plane.

A light projection optical system 21 of a focus detector projects a plurality of light beams formed by non-exposure light to which the photoresist on the substrate 15 is not sensitive, and each light beam is focused on and reflected by the substrate 15. The light beam reflected by the substrate 15 enters a detection optical system 22 of the focus detector. The detection optical system 22 has a plurality of position detection light-receiving elements in correspondence with the respective reflected light beams, and is configured so that the light-receiving surface of each position detection light-receiving element is conjugate with the reflection point of each light beam on the substrate 15 by an imaging optical system. Misregistration of each detection position (reflection point position) on the surface of the substrate 15 in the direction of the optical axis of the projection optical system 14 is measured as misregistration of a light beam incident on the corresponding position detection light-receiving element of the detection optical system 22.

In this embodiment, the reticle 13 and substrate 15 are positioned to have a predetermined relationship. Based on a synchronization signal from the main control unit 3, the laser control unit 2, the substrate stage control unit 20, and a reticle stage control unit 26 perform a scan exposure to transfer the pattern 32 on the entire surface of the reticle to a shot region on the substrate 15. The substrate stage 16 then drives the substrate 15 within the X-Y plane by a predetermined amount, thereby performing a scan exposure for another shot region on the substrate 15 in a similar manner. This operation is repeated to sequentially expose the shot regions by a so-called step-and-scan scheme.

Figure 3A:
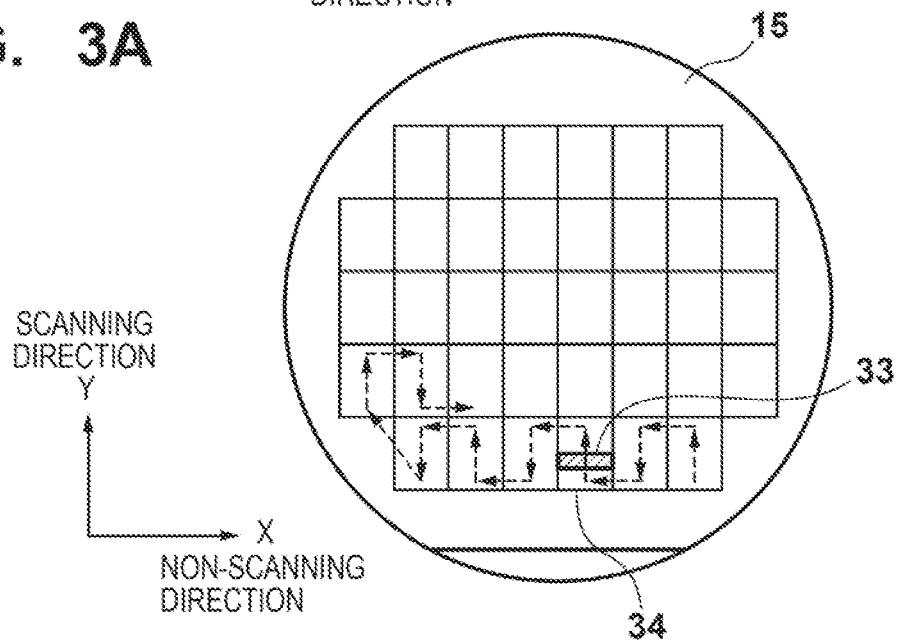
FIGS. 3A and 3B are views showing a scan exposure.
Figure 3B:
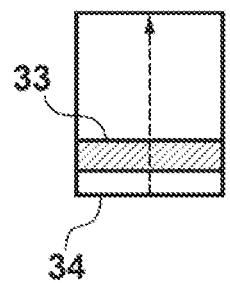

FIG. 3A shows a case in which the respective shot regions on the substrate 15 undergo a scan exposure by repeating the step-and-scan scheme in an order indicated by broken arrows. Reference numeral 34 denotes one shot region (a range within which the pattern 32 on the reticle 13 is exposed by one scan operation); and 33, the slit-shaped light. A direction Y indicates a scanning direction, and a non-scanning direction X indicates a direction perpendicular to the scanning direction. FIG. 3B is an enlarged view showing the shot region 34. The slit-shaped light 33 is exposure light which passes through the projection optical system 14 to form an image. In this embodiment, an exposure amount distribution in the Y-axis direction (scanning direction) within the shot region 34 is adjusted by controlling a light intensity distribution in the Y-axis direction (scanning direction) of the slit-shaped light 33 at each position within the shot region 34.

A method of adjusting an exposure amount at each position within a shot region for the exposure apparatus will be described. When performing a scan exposure for the shot region 34 on the substrate 15 via the pattern 32 formed on the reticle 13, one of important conditions under which the finishing size of the pattern transferred to the shot region is determined is an exposure amount. Adjustment of an exposure amount indicates adjustment of an exposure amount distribution in the scanning direction within the shot region. To perform a scan exposure in the scanning direction with the slit-shaped light 33, an irradiated (projected) accumulated energy amount, that is, the exposure amount distribution in the scanning direction is adjusted at each position within the shot region 34 by appropriately controlling the output energy of the laser light source 1 during scanning processing. Processing of controlling the output energy of the laser light source 1 to adjust the exposure amount distribution in the scanning direction (the Y-axis direction) will be described first.

Figure 4A:
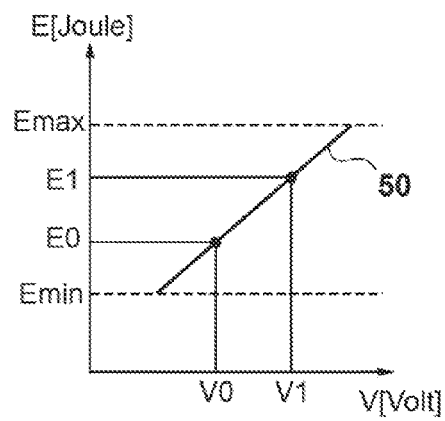
FIGS. 4A to 4E are views for explaining the output characteristics of a laser light source and an exposure amount distribution in a scanning direction.

FIG. 4A shows the characteristics of pulse energy output from the laser light source 1. An abscissa V represents the application voltage [Volte] of the laser light source 1, and an ordinate E represents the output pulse energy value [Joule] of the laser light source 1. A control characteristic 50 has the output pulse energy value E which increases in proportion to the application voltage V. If the application voltage is raised from V0 to V1, the output pulse energy rises from E0 to E1. An energy characteristic K in this case is represented by:

$$K[J/V]=(E1-E0)/(V1-V0) \tag{1}$$

In FIG. 4A, Emax indicates the upper limit of the output pulse energy of the laser light source 1. Even if an application voltage higher than Emax is applied, it is impossible to obtain output pulse energy according to the energy characteristic represented by equation (1). Similarly, Emin indicates the lower limit of the output pulse energy of the laser light source 1. Even if an application voltage lower than Emin is applied, it is impossible to obtain output pulse energy according to the energy characteristic represented by equation (1). That is, it is possible to obtain a desired output pulse energy value E by controlling the application voltage based on equation (1) within the allowable range of the laser output from Emin to Emax where Emin and Emax are determined based on the design values of the laser light source 1.

To measure the energy characteristic K, a light amount detector 27 arranged on the substrate stage 16 is used. After driving the substrate stage 16 within the X-Y plane by a predetermined amount so that the light amount detector 27 is positioned on an optical path, a predetermined voltage V is applied to the laser light source 1, thereby repeating a pulse exposure. The exposure light having passed through the projection optical system 14 passes a pin hole (not shown) with a diameter of several hundred μm formed in the upper surface of the light amount detector 27 to enter a light-receiving unit (not shown). A photodiode is arranged in the light-receiving unit of the light amount detector 27, and outputs an amount of current corresponding to the light intensity of the exposure light. It is possible to measure the output pulse energy value E based on the light intensity of the exposure light reaching the substrate 15 (image plane).

Figure 4B:
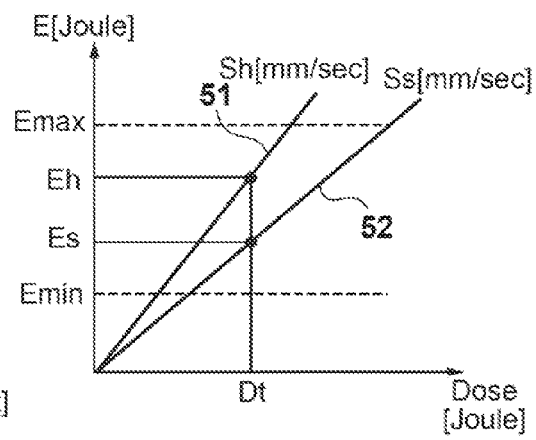

Referring to FIG. 4B, an ordinate E represents the output pulse energy value [Joule] of the laser light source 1, and an abscissa Dose represents the exposure amount [Joule] of the substrate 15, which is obtained by emitting a predetermined number of pulses from the laser light source 1 and accumulating them. A line 51 indicates the relationship between the output pulse energy E and the exposure amount D when performing a scan exposure at a scanning speed Sh [mm/sec]. A line 52 indicates the relationship between the output pulse energy E and the exposure amount D when performing a scan exposure at a scanning speed Ss [mm/sec]. The scanning speeds satisfy Sh (51)>Ss (52).

Let Dt be the target exposure amount on the substrate 15. If the scanning speed is as relatively high as Sh, it is possible to obtain the target exposure amount Dt at the scanning speed by irradiating the substrate 15 with the output of the laser light source 1 at an illuminance as high as Eh by a predetermined number of pulses. If the scanning speed is as relatively low as Ss, it is possible to obtain the target exposure amount Dt at the scanning speed by irradiating the substrate 15 with the output of the laser light source 1 at an illuminance as low as Es by the predetermined number of pulses. If the output pulse energy of the laser light source 1 is large with respect to the target exposure amount Dt to irradiate the substrate at a high illuminance, the scanning speed can be increased. Alternatively, if the output pulse energy is small to irradiate the substrate at a low illuminance, the scanning speed becomes low.

Figure 4C:
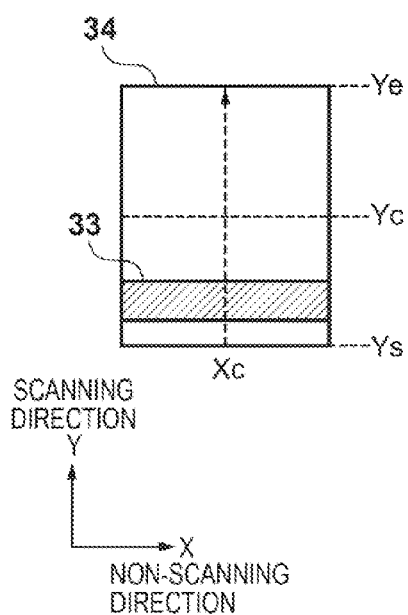

FIG. 4C shows a schematic view showing a case in which the shot region 34 undergoes a scan exposure with the slit-shaped light 33 along a direction indicated by an arrow. In FIG. 4C, the Y-axis direction indicates a scanning direction in which the substrate 15 is scanned with the slit-shaped light 33, and the X-axis direction indicates a non-scanning direction perpendicular to the Y-axis direction. Furthermore, Xc represents the center (optical axis) in the non-scanning direction X, Ys represents an exposure start position in the scanning direction Y, Yc represents the center position in the scanning direction Y, and Ye represents an exposure end position in the scanning direction Y.

Figure 4D:
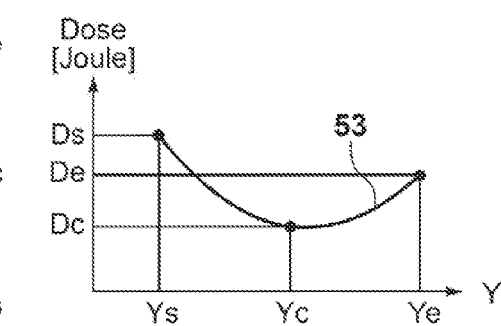
Figure 4E:
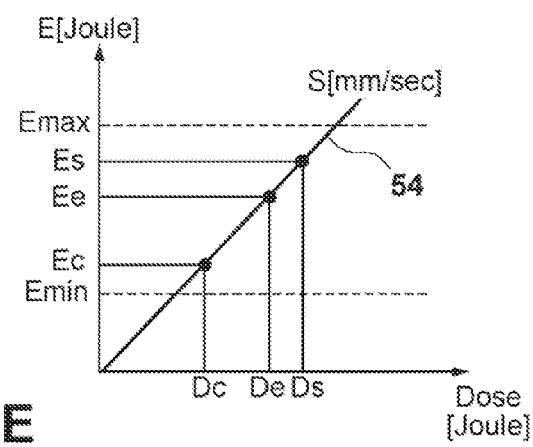

Referring to FIG. 4D, the abscissa represents the position coordinate in the shot region 34 in the scanning direction Y, the ordinate represents an exposure amount Dose at the optical axis Xc, and a line 53 represents the shot exposure amount distribution in the shot region 34. Furthermore, Ds indicates an exposure amount at the exposure start position Ys, Dc indicates an exposure amount at the center position Yc, De indicates an exposure amount at the exposure end position Ye, and the exposure amount distribution 53 is set to have a curve shape. Referring to FIG. 4E, a line 54 indicates the relationship between the output pulse energy E of the laser light source 1 when performing a scan exposure at a scanning speed S [mm/sec] and the exposure amount D in the shot region 34, similarly to FIG. 4B.

Upon start of exposing the shot region 34 at the scanning speed S, the slit-shaped light 33 passes through the positions Ys, Yc, and Ye in the shot region 34 in the order named. During the scan exposure of the shot region 34, the application voltage of the laser light source 1 is controlled so as to obtain the output pulse energy Es which provides the exposure amount Ds when the slit-shaped light 33 is at the position Ys. Similarly, the application voltage of the laser light source 1 is controlled so as to obtain the output pulse energy Ec which provides the exposure amount Dc at the position Yc. Furthermore, the application voltage of the laser light source 1 is controlled so as to obtain the output pulse energy Ee which provides the exposure amount De at the position Ye. As described above, it is possible to obtain the exposure amount distribution 53 at positions in the scanning direction within the shot region by controlling the application voltage of the laser light source 1.

Figure 5:
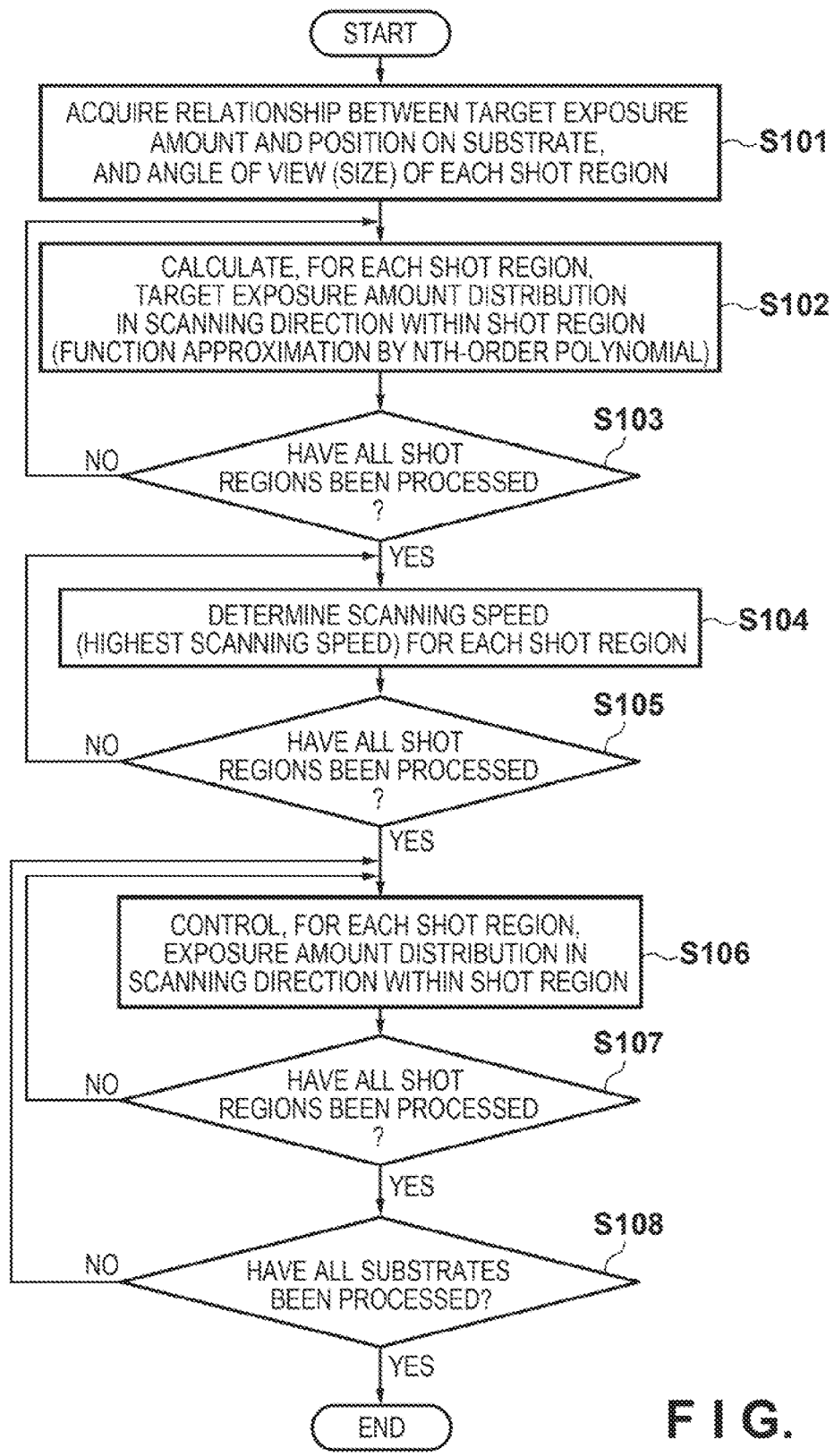
FIG. 5 is a flowchart illustrating a method of controlling an exposure amount within a shot region.
Figure 6A:
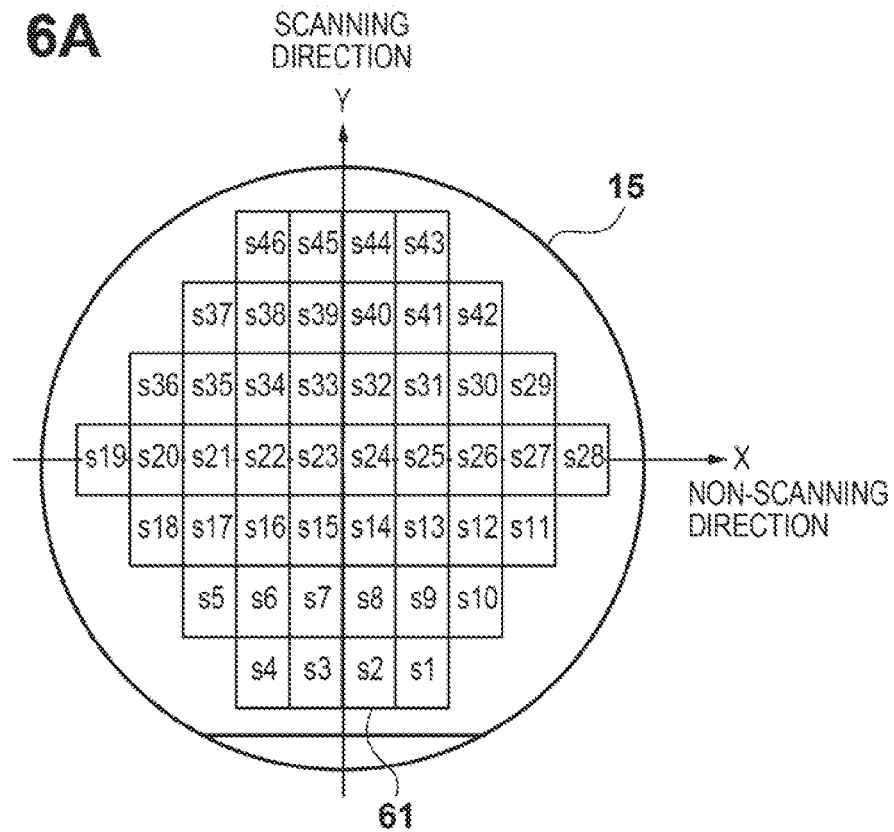
FIGS. 6A and 6B are views for explaining the relationship between a target exposure amount (target dose) and a position on a substrate.

A procedure of controlling the exposure amount distribution within the shot region to uniform a line width distribution within the shot region will be described with reference to a flowchart shown in FIG. 5. Upon start of exposure processing, an acquisition unit 28 acquires and stores information indicating the relationship between a target exposure amount and a position on the substrate 15 in step S101. FIG. 6A is a view schematically showing an array of shots s1 to s46 when exposing the substrate 15 by the step-and-scan scheme. In FIG. 6A, the Y-axis direction indicates the scanning direction in which the substrate 15 is scanned with the slit-shaped light 33, and the X-axis direction indicates the non-scanning direction perpendicular to the Y-axis direction. The intersection of the X- and Y-axes indicates the center of the substrate 15. In this embodiment, the information indicating the relationship between a target exposure amount and a position on the substrate 15 is represented by a second-order polynomial function:

$$\text{Dose}(X,Y)[J]=aX^2+bY^2+cXY+dX+eY+f \tag{2}$$

Equation (2) defines a target exposure amount according to the distance from the center of the substrate.

In equation (2), X represents the coordinate in the non-scanning direction when the center of the substrate is set as the origin, Y represents the coordinate in the scanning direction when the center of the substrate is set as the origin, and Dose(X, Y) represents the target exposure amount [Joule] at the position (X, Y) on the substrate 15. The line width of the pattern transferred on the substrate by the scan exposure is correlated with the film thickness of the resist on the substrate. The film thickness of the resist on the substrate is approximated well by equation (2). As can be analogically determined based on this, equation (2) is usable to represent a target exposure amount for improving the line width uniformity on the substrate. An advantageous equation indicating the relationship between a target exposure amount and a position on the substrate 15 is not limited to equation (2), and it is possible to set an equation according to the status of an actual lithography process. It is possible to obtain coefficients a to f of equation (2) by performing approximation using a quadratic surface according to a target exposure amount on the substrate 15, which has been obtained so as to uniform the line width. It is also possible to obtain the coefficients a to f of equation (2) using exposure amount measurement results at various positions on the substrate.

Figure 6B:
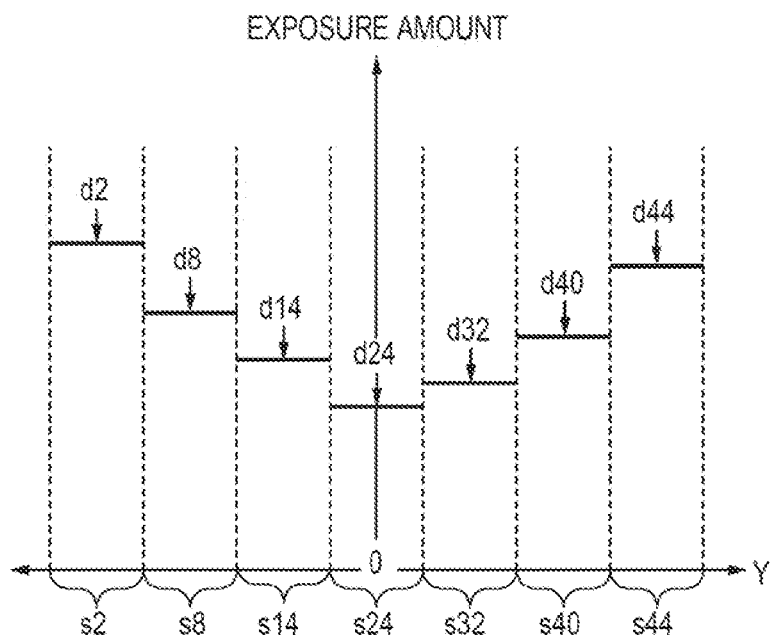

Referring to FIG. 6B, the abscissa represents the distance from the center of the wafer in the Y direction, and the ordinate represents an exposure amount. Each of lines d2, d8, d14, d24, d32, d40, and d44 indicates a target exposure amount in the scanning direction Y at the shot center (optical axis) of corresponding one of the seven shot regions s2, s8, s14, s24, s32, s40, and s44 at the same position in the X-axis direction and different positions in the Y-axis direction. Equation (2) defines a target exposure amount according to the distance from the center of the substrate. It is possible to obtain a target exposure amount at the shot center of each shot region by substituting the coordinates (X, Y) of the shot center of each shot region into equation (2). As described above, in step S101, the coordinates (X, Y) of a position in each shot region, information about the angle of view (size) of each shot region, and the coefficients a to f of equation (2) are set in the acquisition unit 28 as the information indicating the relationship between a target exposure amount and a position on the substrate 15.

Figure 7A:
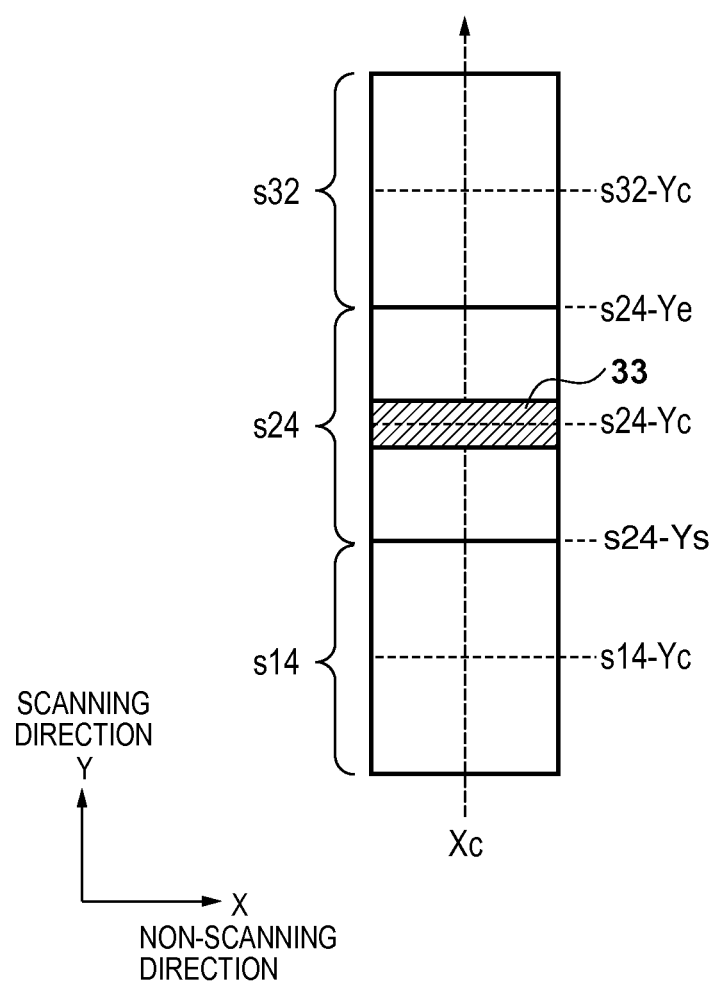

The process advances to step S102, and the main control unit 3 calculates, for each target shot region for which a target exposure amount distribution is to be obtained, a target exposure amount distribution in the scanning direction within the shot region based on the information which has been stored in the acquisition unit 28 and indicates the relationship between a target exposure amount and a position on the substrate. FIG. 7A is a schematic view showing the shot s24 and the shots s14 and s32 adjacent to it in the scanning direction, which are shown in FIG. 6A. Referring to FIG. 7A, the Y-axis direction indicates the scanning direction in which the substrate 15 is scanned with the slit-shaped light 33, and the X-axis direction indicates the non-scanning direction perpendicular to the Y-axis direction. In FIG. 7A, Xc represents the center (optical axis) of the non-scanning direction X, s24-Ys represents the exposure start position of the shot s24, s24-Yc represents the center position of the shot s24, and s24-Ye represents the exposure end position of the shot s24. Furthermore, s14-Yc indicates the center position of the shot s14 adjacent to the shot s24, and s32-Yc indicates the center position of the shot s32 adjacent to the shot s24.

Referring to FIG. 7B, the abscissa represents a position coordinate in the scanning direction Y in the shot region s14, s24, or s32, and the ordinate represents an exposure amount dose(y) at the optical axis Xc. Each of a plurality (five) of sets of position coordinates (0, s14-Yc), (0, s24-Ys), (0, s24-Yc), (0, s24-Ye), and (0, s32-Yc) is substituted into equation (2) described above and indicating the relationship between a target exposure amount and a position on the substrate 15. Target exposure amounts d14c, d24s, d24c, d24e, and d32c at the five positions are obtained. To calculate a target exposure distribution in the scanning direction within the shot s24, approximation is performed based on target exposure amounts at the five positions including a target exposure amount at least at one position in the adjacent shots s14 and s32 using a fourth-order polynomial function:

$$\text{dose}(y)[J] = a_n y^4 + b_n y^3 + c_n y^2 + d_n y + e_n \quad (3)$$

where $a_n$ to $e_n$ are coefficients in the nth shot region. For the shot s24, $a_{24}$ to $e_{24}$ are used. Equation (3) indicates a target exposure amount distribution within each shot region, which is represented as a function of the exposure amount having, as a variable, a position in the scanning direction within each shot region.

In equation (3), y represents the coordinate of a position in the scanning direction Y within each shot region, and dose(y) represents a target exposure amount [Joule] at the position indicated by the coordinate y in the scanning direction within each shot region. A line 71 in FIG. 7B is obtained by approximating exposure amounts at the five positions in the shots s14, s24, and s32 according to equation (3). This approximation curve can correctly represent a target exposure amount distribution at a position in the scanning direction within the shot s24. As described above, in step S102, for each of the shots s1 to s46, the main control unit 3 approximates a target exposure amount distribution within the shot region using the fourth-order polynomial function represented by equation (3), and obtains and stores the coefficients $a_n$ to $e_n$ (n is an integer between 1 and 46) of equation (3) for the shot region. Note that in the example of the shot s24 shown in FIG. 7A, the target exposure amounts at positions in the two adjacent shots are used to obtain the coefficients $a_{24}$ to $e_{24}$. However, for example, if there is only one adjacent shot like the shot s2, it is only necessary to use target exposure amounts at five positions in total, including two or three positions in the shot s2 and three or two positions in one adjacent shot. Note that although a target exposure amount distribution in the scanning direction within a shot region is approximated using the fourth-order polynomial function in this embodiment, it may be approximated using a high-order polynomial function other than the four-order polynomial function.

In step S103, the main control unit 3 determines whether calculation of a target exposure amount distribution within a shot region has been performed for all the shots. If calculation has been performed for all the shots, the process advances to step S104. In step S104, the main control unit 3 determines, for each shot region, based on the target exposure amount distribution within the shot region obtained in step S102, a highest scanning speed S which achieves a largest exposure amount within the shot region. To obtain a high throughput, the main control unit 3 performs a scan exposure for the shot region at the determined highest scanning speed S. As described above with reference to FIG. 4B, it is possible to increase the scanning speed by increasing the output pulse energy of the laser light source 1 and performing irradiation at a high illuminance. For the exposure amount distribution 71 within the shot s24 exemplified in FIG. 7A, the largest exposure amount d24s is obtained at the position s24-Ys in the scanning direction.

Figure 8A:
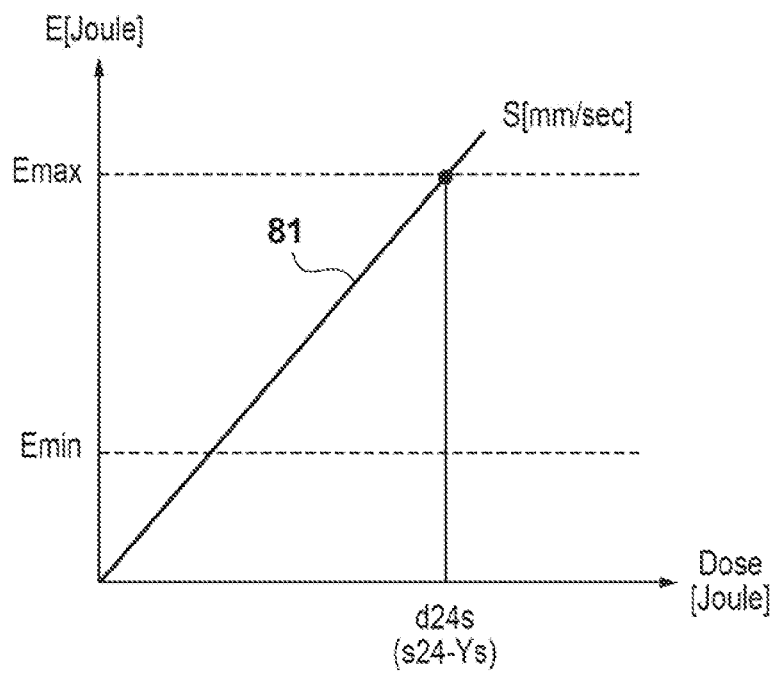
FIGS. 8A and 8B are views for explaining processing of controlling an exposure amount distribution within a shot region.

The scanning speed S is calculated at which an accumulated energy value obtained by irradiating the substrate 15 by a predetermined number of pulses (a smallest number of exposure pulses for satisfying a exposure amount control accuracy) with the upper limit value Emax of the output pulse energy of the laser light source 1 provides the largest exposure amount d24s within the shot region. In FIG. 8A, the ordinate represents the output pulse energy value E [Joule] of the laser light source 1, and the abscissa represents the exposure amount Dose [Joule] of the substrate 15. Referring to FIG. 8A, if the substrate is irradiated by the predetermined number of pulses with the upper limit value Emax of the output pulse energy at the scanning speed S indicated by a line 81, the largest exposure amount d24s within the shot region is obtained at the scanning position s24-Ys within the shot region.

Figure 8B:
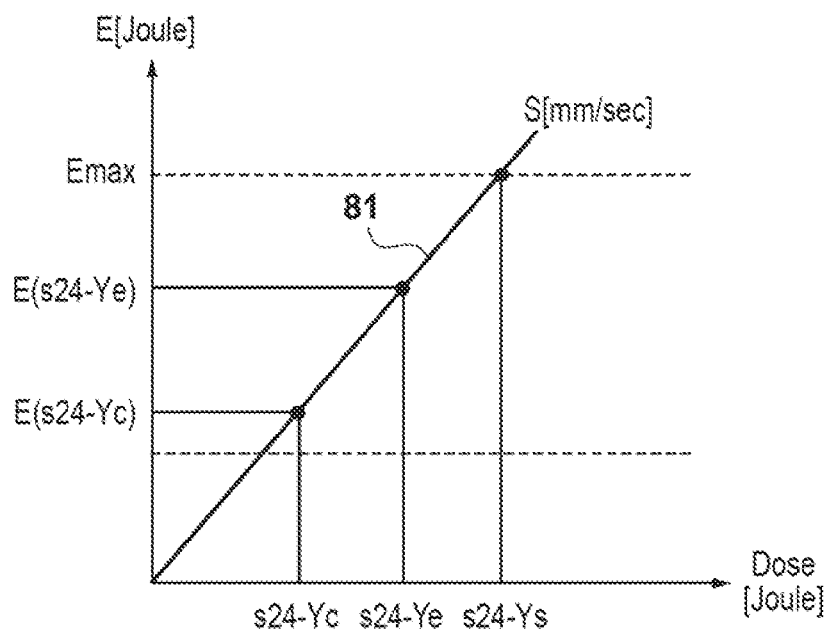

In step S105, it is determined whether the scanning speed S for each shot region has been determined for all the shot regions. If the scanning speed S has been determined for all the shot regions, the process advances to step S106. Referring to FIG. 8B, the line 81 indicates the relationship between the output pulse energy E and the exposure amount Dose when performing a scan exposure at the scanning speed S [mm/sec] so as to obtain the target exposure amount distribution 71 within the shot s24 exemplified in FIG. 7C.

Upon start of a scan exposure at the scanning speed S for the shot region s24, the slit-shaped light 33 passes through the positions s24-Ys, s24-Yc, and s24-Ye in the shot region s24 in the order named. Let E(s24-Ys) be output pulse energy which provides the exposure amount d24s when the slit-shaped light 33 is at the position s24-Ys. In this case, E(s24-Ys) is equal to the upper limit value Emax of the output pulse energy of the laser light source 1. Output pulse energy E(s24-Yc) which provides the exposure amount d24c at the position s24-Yc and output pulse energy E(s24-Ye) which provides the exposure amount d24e at the position s24-Ye are as shown in FIG. 8B. During the scan exposure of the shot s24 at the scanning speed S, the main control unit 3 successively obtains a position in the scanning direction by causing the laser interferometer 18 to measure the position of the substrate stage 16. The main control unit 3 can then obtain the target exposure amount distribution 71 as the exposure amount distribution in the scanning direction within the shot region by controlling the output pulse energy E of the laser light source 1 according to the obtained position in the scanning direction and controlling the application voltage according to the relationship shown in FIG. 8B.

In step S107, it is determined whether the scan exposure has been performed for all the shot regions. If the scan exposure has been performed for all the shot regions, the substrate 15 is unloaded and the process advances to step S108. In step S108, it is determined whether the scan exposure has been performed for a predetermined number of substrates belonging to one lot. If the scan exposure has not been performed for all the substrates, a new substrate 15 is loaded to repeat the exposure amount control and scan exposure processing in step S106. In this embodiment, it is possible to precisely adjust an exposure amount distribution within a shot region, thereby improving the line width uniformity of a pattern.

Embodiment of Device Manufacturing

A method of manufacturing a device (for example, a semiconductor device or a liquid crystal display device) according to the embodiment of the present invention will be described next. A method of manufacturing a semiconductor device will be exemplified here.

A semiconductor device is manufactured by a preprocess of forming an integrated circuit on a substrate, and a post-process of completing, as a product, a chip of the integrated circuit formed on the substrate by the preprocess. The preprocess includes a step of performing a scan exposure for the substrate coated with a photosensitive agent using the above-described exposure apparatus, and a step of developing the substrate. The post-process includes an assembly step (dicing and bonding) and packaging step (encapsulation). Note that a liquid crystal display device is manufactured by a step of forming a transparent electrode. The step of forming a transparent electrode includes a step of coating with a photosensitive agent a glass substrate on which a transparent conductive film is deposited, a step of performing a scan exposure for the glass substrate coated with the photosensitive agent using the above-described exposure apparatus, and a step of developing the glass substrate. The device manufacturing method according to the embodiment is more advantageous in at least one of the productivity and quality of devices than the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-116913, filed May 22, 2012, which is hereby incorporated by reference herein in its entirety.

What is claimed is:

1. An exposure apparatus for performing a scan exposure for each shot region on a substrate, the exposure apparatus comprising:
   a control unit configured to:
      calculate a target exposure amount distribution within a target shot region by performing function approximation using the target exposure amount at a position in the target shot region and a target exposure amount at a position in an adjacent shot region adjacent to the target shot region; and
      perform a scan exposure for the target shot region while controlling an exposure amount to obtain the calculated target exposure amount distribution as an exposure amount distribution within the target shot region.

2. The apparatus according to claim 1, wherein said control unit is configured to obtain the target exposure amount at the position in the target shot region and the target exposure amount at the position in the adjacent shot region based on information indicating a relationship between a target exposure amount and a position on the substrate.

3. The apparatus according to claim 2, wherein the information indicating the relationship between the target exposure amount and the position on the substrate includes exposure amount measurement results at a plurality of positions on the substrate.

4. The apparatus according to claim 2, wherein a relationship between the position on the substrate and the target exposure amount is represented by a function having, as a variable, a second-order of the position on the substrate.

5. The apparatus according to claim 2, wherein a relationship between the position on the substrate and the target exposure amount is represented by a function having, as a variable, the position on the substrate, the target exposure amount distribution within the target shot region is represented as a function having, as a variable, the position of the target shot region, and an order of the function of the target exposure amount distribution having, as a variable, the position on the substrate is higher than an order of the function of the target exposure amount having, as a variable, the position on the substrate.

6. The apparatus according to claim 1, wherein said control unit obtains the target exposure amount distribution in a scanning direction of the scan exposure within the target shot region by performing function approximation using the target exposure amount at the position in the target shot region and the target exposure amount at the position in the adjacent shot region adjacent to the target shot region in the scanning direction.

7. The apparatus according to claim 6, wherein said control unit obtains the target exposure amount distribution in the scanning direction as a function of an exposure amount having, as a variable, a position in the scanning direction within the target shot region.

8. The apparatus according to claim 1, wherein said control unit obtains the target exposure amount distribution using target exposure amounts at a plurality of positions in the target shot region, and target exposure amounts at a plurality of positions in the adjacent shot region.

9. The apparatus according to claim 1, further comprising:
a laser light source that generates exposure light to which the substrate is exposed,
wherein said control unit performs the scan exposure for the target shot region while controlling an output of said laser light source based on the target exposure amount distribution within the target shot region.

10. The apparatus according to claim 9, wherein:
said control unit determines a scanning speed for the substrate when scanning the target shot region based on the target exposure amount distribution within the target shot region and an allowable range of the output of said laser light source, and
said control unit performs the scan exposure for the target shot region while moving the substrate in a scanning direction at the determined scanning speed and controlling the output of said laser light source to obtain the calculated target exposure amount distribution as the target exposure amount distribution within the target shot region.

11. A method of manufacturing a device, the method comprising the steps of:
exposing a substrate to radiant energy using an exposure apparatus of performing a scan exposure for each shot region on a substrate;
developing the exposed substrate; and
processing the developed substrate to manufacture the device, wherein the exposure apparatus includes a control unit configured to:
calculate a target exposure amount distribution within a target shot region by performing function approximation using the target exposure amount at a position in the target shot region and a target exposure amount at a position in an adjacent shot region adjacent to the target shot region; and
perform a scan exposure for the target shot region while controlling an exposure amount to obtain the calculated target exposure amount distribution as an exposure amount distribution within the target shot region.

12. An exposure method of performing a scan exposure for each shot region on a substrate, the method comprising:
a step of calculating a target exposure amount distribution within a target shot region by performing function approximation using the target exposure amount at a position in the target shot region and a target exposure amount at a position in an adjacent shot region adjacent to the target shot region; and
a step of performing a scan exposure for the target shot region while controlling an exposure amount to obtain the calculated target exposure amount distribution as an exposure amount distribution within the target shot region.

* * * * *